United States Patent [19]

Vanderford

[11] 4,278,964
[45] Jul. 14, 1981

[54] SEISMIC PLAYBACK SYSTEM

[75] Inventor: James R. Vanderford, Darien, Conn.

[73] Assignee: Texaco Inc., White Plains, N.Y.

[21] Appl. No.: 474,280

[22] Filed: May 29, 1974

Related U.S. Application Data

[63] Continuation of Ser. No. 153,077, Jun. 14, 1971, abandoned.

[51] Int. Cl.² ............................................. H03K 13/02
[52] U.S. Cl. ............................................. 340/347 DA
[58] Field of Search ........... 235/150.5, 150.52, 150.53, 235/197; 340/347 DA

[56] References Cited

U.S. PATENT DOCUMENTS

| | | | |
|---|---|---|---|
| 3,239,833 | 3/1966 | Gray | 340/347 DA |
| 3,303,489 | 2/1967 | Krucoff | 340/347 DA |
| 3,396,380 | 8/1968 | Ohashi | 340/347 DA |
| 3,573,795 | 4/1971 | Bowers | 340/347 DA |

Primary Examiner—Charles D. Miller
Attorney, Agent, or Firm—Robert A. Kulason; Ronald G. Gillespie

[57] ABSTRACT

Hereinafter disclosed is methodology and apparatus for converting wide dynamic amplitude range digital data recorded in floating point digital word form, comprising a binary coded mantissa and a binary coded exponent, to an analog signal, or oscillogram, of selectively compressed and/or amplified dynamic amplitude range. The digital word, occupying a number of binary bit positions, is, in algebraic form, $\pm AG^E$; where A represents the mantissa, or argument, G represents the base, or radix, of the number system used and E represents the exponent. Since the base G is constant, for example at 8, the only binary bits that need to be recorded are those representing the mantissa A and the exponent E. In reconverting the digital data to analog form for making an oscillogram, or wiggle trace, it is desired to selectively amplify and/or compress the dynamic range and, yet, at the same time avoid introducing serious distortion. The methodology employed to accomplish such reconversion is to change either, or both, the mantissa A and base, or radix, G in such a way that the dynamic range is compressed and, yet, any distortion thereby introduced is minimal. Apparatus for performing the aforesaid changes, among other things, is disclosed.

4 Claims, 3 Drawing Figures

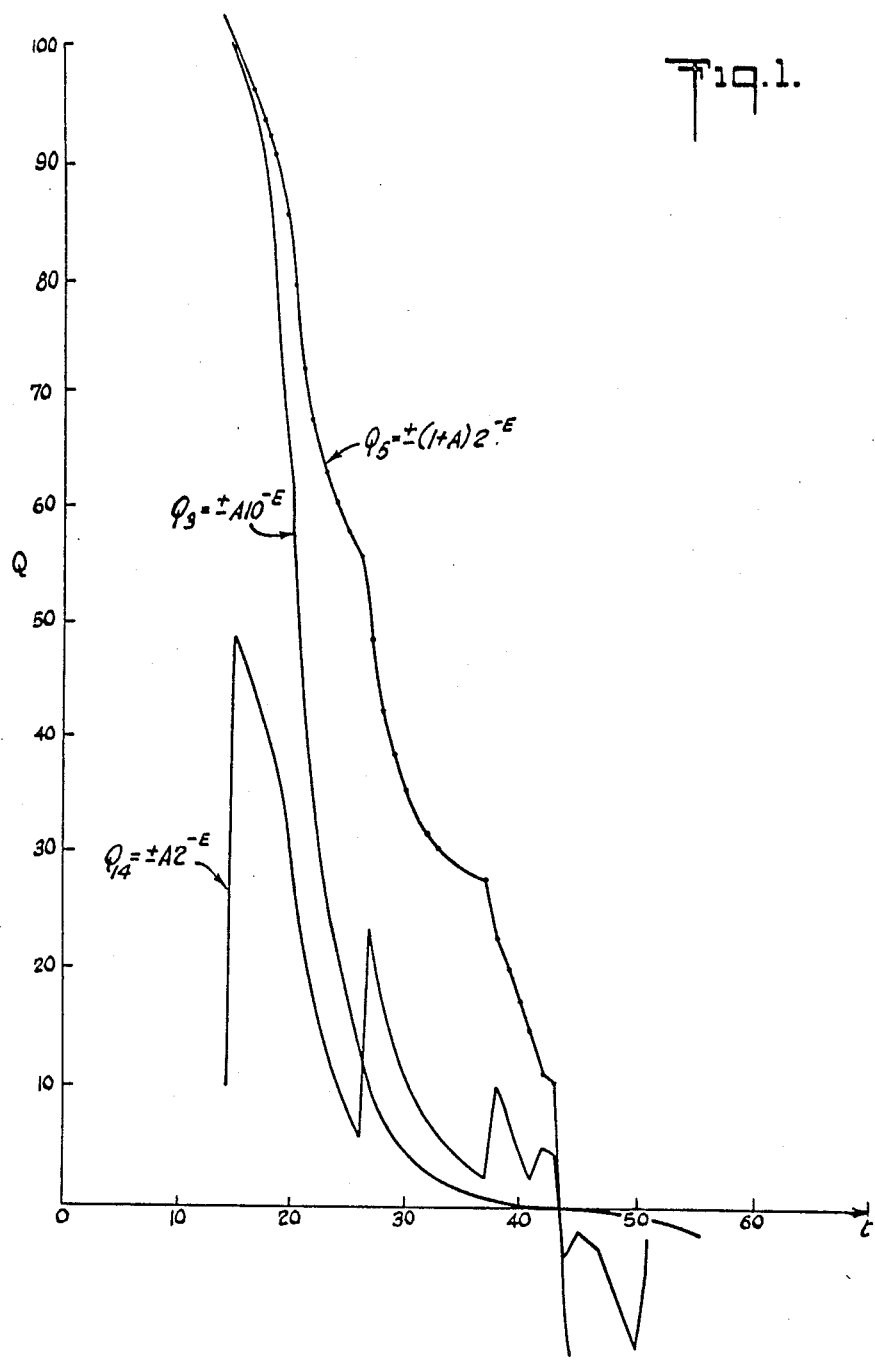

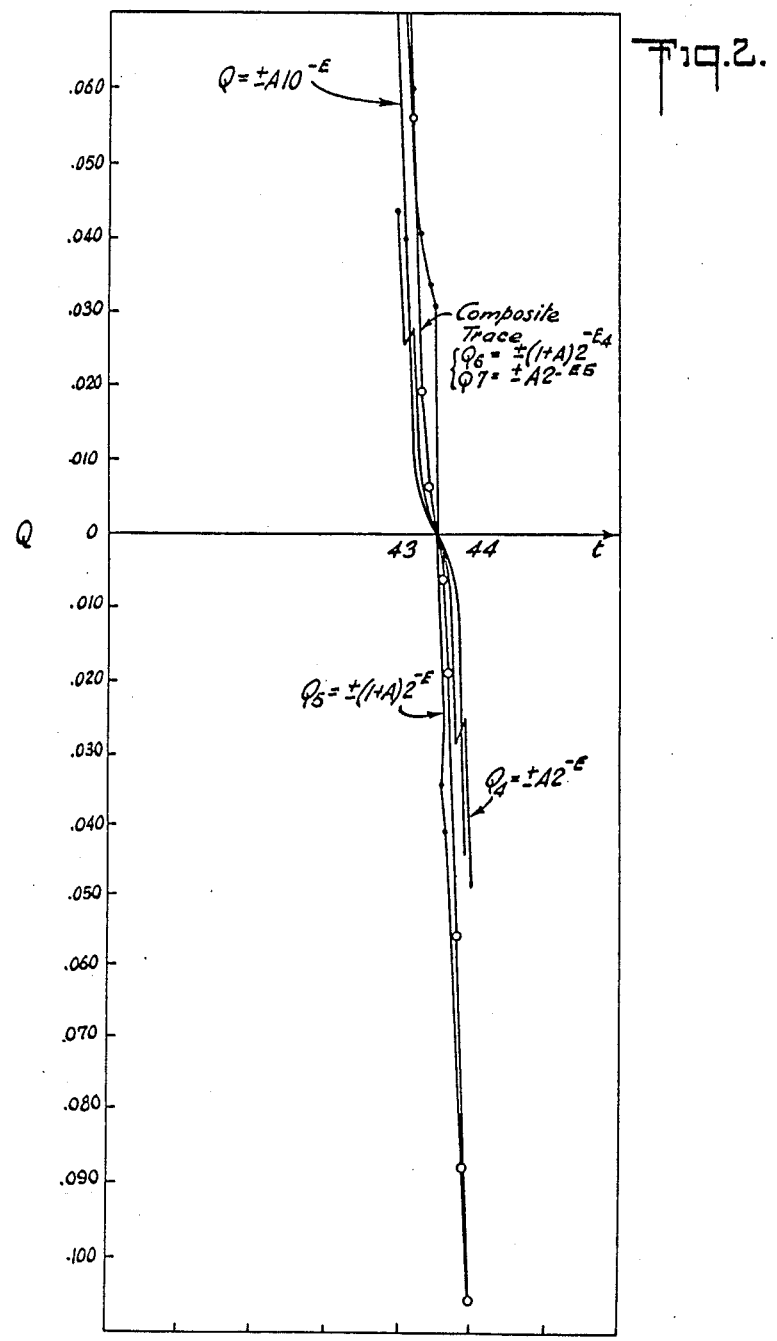

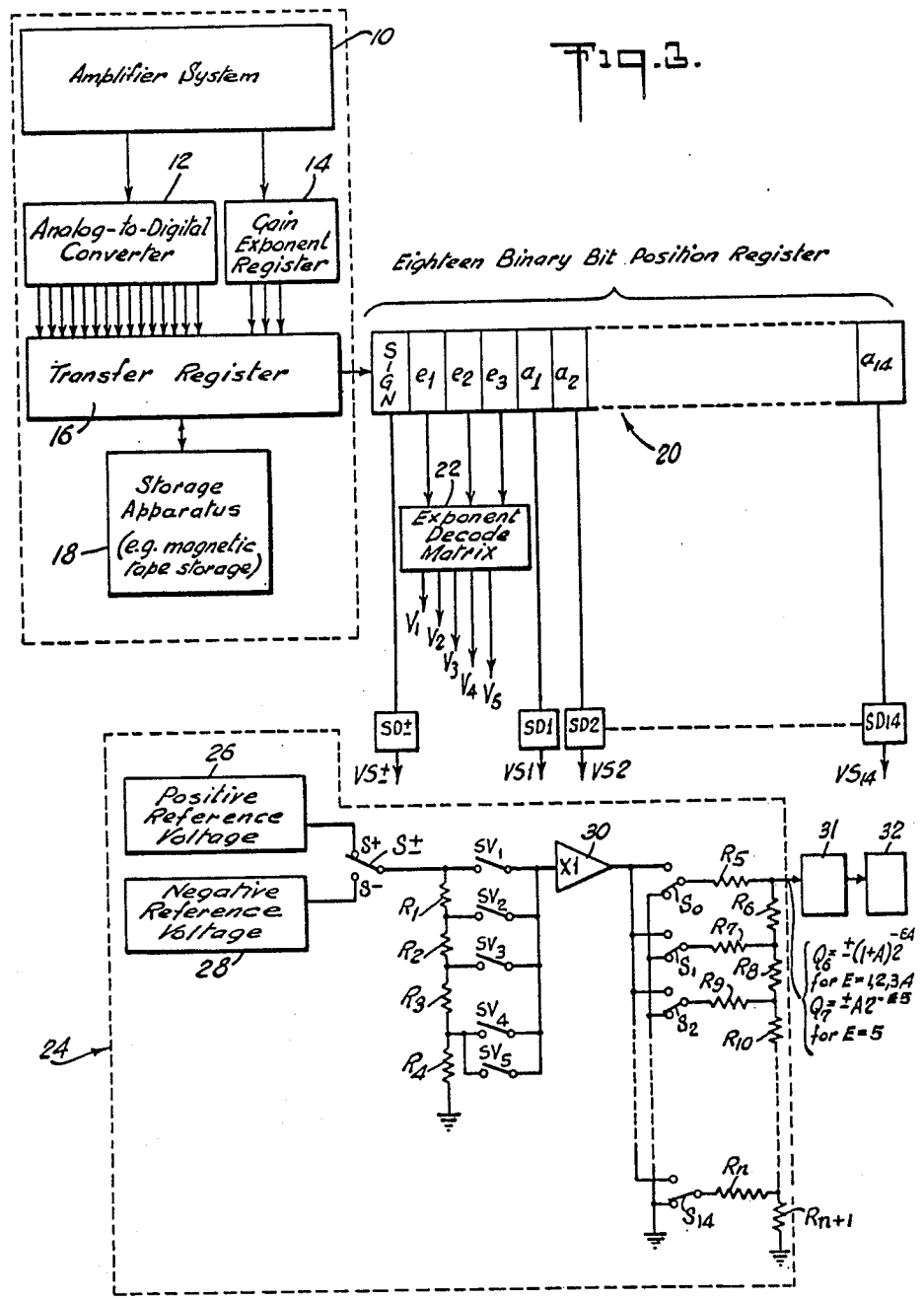

SEISMIC PLAYBACK SYSTEM

This is a continuation of application Ser. No. 153,077, filed June 14, 1971, now abandoned.

BACKGROUND OF THE INVENTION

This invention pertains, in general, to making analog form playbacks from digitally recorded data (e.g., seismic data) which has been digitized from wide dynamic amplitude range analog form data signals initially generated by transducers, such as geophones in response to acoustically induced seismic disturbances; and, in particular, to the making of analog form playbacks such as oscillograms (or wiggle traces as they are often called by those engaged in seismic work) which are approximate, but very useful, reproductions in compressed range of the wide dynamic range amplitude-versus-time characteristic curves of the analog signal initially generated by the aforesaid transducers or geophones.

For example, in seismic exploration work each acoustically driven geophone generates wide dynamic amplitude range signals in analog form. When such signals are processed through a digital seismic recording system of the type disclosed in the patents and patent application hereinafter identified there is produced a high fidelity record, in digital form, covering the wide dynamic range of amplitudes of the signals. The reason that the digital form record is referred to herein as a high fidelity record is because the signal amplitudes are recorded accurately throughout their wide dynamic range; e.g., many binary bit positions are used to accurately record the highest signal amplitudes as well as the lowest where the range (i.e., the ratio of highest amplitudes to the lowest) may be of the order of $10^6$. The invention hereinafter disclosed provides methodology and apparatus for making analog form oscillograms, or wiggle traces, from the recorded digital data. The oscillograms, or wiggle traces, are of relatively lower fidelity than the aforementioned digitally recorded data. Although, said oscillograms are of relatively lower fidelity, serious distortions are, nevertheless, not introduced in reconverting the digital data to analog form data.

The recordation in digital form of wide dynamic amplitude range analog form signals initially generated by geophones is disclosed in, among others, the following: U.S. Pat. No. 3,241,100, granted Mar. 15, 1966 in behalf of R. J. Loofbourrow and entitled "Digital Seismic Recording System"; U.S. Pat. No. 3,264,574, granted Aug. 2, 1966, in behalf of R. J. Loofbourrow and entitled "Amplifier System"; and, U.S. Patent Application Ser. No. 786,706 now U.S. Pat. No. 3,603,972, filed Dec. 24, 1968 in behalf of James R. Vanderford and entitled "Amplifier System".

Although the invention is hereinafter described as being employed in conjunction with digital seismic recording systems such as those disclosed in the patents and patent application hereinbefore identified it is, nevertheless, to be understood that the invention's field of use is not limited to seismic data processing.

As is disclosed in the patents and patent application herein disclosed the problem solved is the problem of accurately recording seismic data which is analog form has a dynamic range of amplitudes which is extremely wide. For example, a typical analog signal level for a reflection siesmic record runs from several volts of amplitude at its maximum, at the early shock portion of the record, to less than a single microvolt at the end of the seismic record when very low amplitude seismic disturbances are detected. To put it very generally, the aforementioned patents and patent application solve the problem by converting the wide dynamic amplitude range analog signals to digital form. When converted to digital form, occupying a relatively large number of binary bit positions, the full dynamic amplitude range of the analog signal initially generated by a geophone is preserved in recorded form on magnetic tape. Advantageously, the magnetically recorded digital data may subsequently be delivered to an electronic computer for further processing. Some ways and some purposes for which such digital data is subsequently processed in an electronic computer are disclosed in an article "Tools for Tomorrow's geophysics" by Milton B. Dobrin and Stanley H. Ward, published in the journal "Geophysical Prospecting", Vol. X, pages 433–452 (1962).

In the aforementioned patent application of Vanderford there is described a system wherein portions of an analog signal are converted to digital words where each digital word occupies a number of binary bit positions. Moreover, each such digital word is recorded in a floating point form. Advantageously, the floating point form, or notation, allows greater flexibility of operation and easier handling of numbers differing greatly from each other in magnitude. (See, for example, the textbook "Digital Computer Primer" by E. M. McCormick, 1959, published by McGraw-Hill Book Co., Inc., beginning at page 152). In the system disclosed in the Vanderford patent application, hereinbefore identified, a floating point digital number, or word, in the form of a mantissa and an exponent is recorded on magnetic tape. The floating point digital number represents the instantaneous absolute seismic voltage amplitude as it enters the floating point amplifier system disclosed by Vanderford. The dynamic range of the floating point digital number, or word, may be in excess of 200 db, if necessary, to cover the dynamic amplitude range of input signals (equivalent of a 36 binary bit digital number, or word). As a specific example, the floating point word as set forth in conventional algebraic form is as follows:

$$Q_1 = \pm AG^{-E} \qquad \text{(Equation 1)}$$

where $Q_1$ represents the absolute magnitude or amplitude of the floating point word; A represents the mantissa, or argument, portion of the word; G represents the base of the number system used (G=10 in the decimal, or base 10, system or G=8 is the octal system); and E represents the exponent.

As is suggested in the Vanderford patent application the floating point digital word is in the form:

$$Q_2 = \pm A8^{-E} \qquad \text{(Equation 2)}$$

where $Q_2$ represents the absolute magnitude of the amplitude of the input signal to an arrangement of amplifiers, each of which has a gain of eight (8) and, hence, the base G in equation 1 becomes an 8 in equation 2; the mantissa A represents the output amplitude of a particular amplifier in the aforesaid arrangement; and E, the exponent, represents the number of amplifier stages of gain of 8 through which the input signal has passed.

In order to record the floating point digital word of equation 2 in a binary register with, for example, 144 db of dynamic range and 14 bit accuracy, 18 bit positions would be required where the mantissa A is represented in binary form (i.e., where the radix, or base, of such a number system is 2) and where the exponent E is also represented in binary form. Of the 18 bits required: 1 bit represents the sign, allowing for bipolar input-output capabilities; 14 bits represent the mantissa; and 3 bits represent the exponent.

Although there are many advantages (some of which are set forth in the aforementioned published article of Dobrin and Ward) to recording seismic signals in digital form there still remains the need to make available to a seismic prospector a visible record of the seismic data, or portions of it. Conventionally, the visible record is an oscillogram, or wiggle trace as it is often called by seismic prospectors. Often, it is desirable for a seismic prospector in a siesmic field crew in a remote location from a main data processing center to take a quick look at a portion of the seismic data from time to time; i.e., look at wiggle traces. For example, a seismic prospector may wish to make some interpretations with respect to the wiggle trace data after coordinating such data with geological data.

The invention, hereinafter disclosed and illustrated in the accompanying drawing figures, is particularly concerned with converting the recorded digital data to the familiar wiggle trace form on recording paper. The recording paper allows about 40 db dynamic amplitude range while the digitally recorded floating point word may have a dynamic range of 156 db, or more. Thus, in converting from digital form to a practical analog form selective amplification and/or attenuation of the various amplitudes must occur. In such a conversion distortion is necessarily introduced. However, the methodology of the present invention minimizes such distortions and, as a result, there is provided analog form data in the form of oscillograms, or wiggle traces, which provide useful information to seismic prospectors, among others.

SUMMARY OF THE INVENTION

One object of the present invention is to convert data from a digital form to an analog form.

Another object of the present invention is to provide new and useful methodology for converting data from digital form to analog form.

Another object of the present invention is to provide new and useful apparatus for converting data from digital form to analog form.

Another object of the present invention is to convert wide dynamic amplitude range digital data; e.g., seismic data to analog form oscillograms, or wiggle traces.

Another object of the present invention is to convert wide dynamic amplitude range digital data to analog form data, such as oscillograms, which oscillograms are selectively amplified and/or attenuated reproductions of wide dynamic amplitude range analog signals which existed prior to their conversion to said digital data.

Another object of the present invention is to convert wide dynamic amplitude range digital form data to analog form data having selectively attenuated and/or amplified amplitudes without introducing serious distortion.

Briefly, in accordance with the invention a recorded floating point digital word, occupying a number of binary bit positions, and having the general algebraic form $\pm AG^{-E}$ (equation 1) is converted to a different algebraic form in order to produce corresponding analog signals having a range of amplitudes which are selectively attenuated and/or amplified. To put it succinctly, the methodology employed is to change one or more of the mantissa A, the radix G, and the exponent E in such a way that the dynamic range is compressed and any distortion introduced thereby is minimal.

Other objects as well as the various features and advantages of the invention will become apparent from the following description when considered in connection with the accompanying drawings which form a part of this specification.

BRIEF DESCRIPTION OF THE DRAWINGS

FIG. 1 is a graphical illustration of three partial oscillograms, or wiggle traces, or a seismic record. The axis or ordinates is scaled in equal units of amplitudes, or magnitudes, Q, and the axis of abscissas is scaled in equal units of elapsed time, t. The trace identified as $Q_3 = \pm A10^{-E}$ (equation 3) represents a portion of an actual, perfect, or undistorted, analog signal which, conceptually, might be generated by a geophone. The trace $Q_3$ if shown in its entirety would cover a dynamic range of amplitudes of the order of $10^6$ and, hence, for the practical purpose of illustrating the trace, and the invention herein disclosed, only a relatively small portion of trace $Q_3$ is illustrated. The trace identified as $Q_4 = \pm A2^{-E}$ (equation 4) represents a first attempt according to the general methodology of the present invention to synthesize a trace which has a form resembling the perfect, or ideal, trace $Q_3$. The other trace identified as $Q_5 = \pm(1+A)2^{-E}$ (equation 5) represents a further attempt according to the general methodology of the invention to synthesize another trace which has a form resembling the perfect, or ideal, trace $Q_3$. The significance of the number "1" in equation 5 is that the maximum amplitude of A has been normalized to unity. In the general form of equation 5 a translation factor F is defined such that equation 5 is of the general form $$Q_{5a} = \pm(F + A)\left(\frac{G}{B}\right)^{-E}$$

(equation 5a) where B is a compression factor which accomplishes the dynamic range compression. In other words the general methodology of this invention is to start with a digitally recorded function of the form $Q_1 = \pm AG^{-E}$ and then recreate a related function with dynamic range compression one form of which is $$Q_{5a} = \pm(F + A)\left(\frac{G}{B}\right)^{-E}.$$

In the example shown in the accompanying figures figures was chosen as unity and B was chosen to have a value 5. In general, and to be consistent with the methodology of the floating point amplifier system, the compression factor B is chosen arbitrarily by the user and the translation factor F in a preferred embodiment is calculated by the formula $F = (B-1)/(G-B)$, it being understood that the mantissa A has been normalized such that its maximum value is unity in the equation $Q_{5a}$. Traces $Q_3$, $Q_4$, and $Q_5$ are drawn to different scales on the ordinate. Therefore, despite appearances to the contrary in FIG. 1 some dynamic range compression has been achieved.

FIG. 2 is another graphical illustration of the aforementioned three partial oscillograms, or wiggle traces, of FIG. 1 and an additional trace identified as COMPOSITE TRACE $Q_6 = \pm(1+A)2^{-E_4}$ (equation 6) or $Q_7 = \pm A 2^{-E_5}$ (equation 7). The traces $Q_3$, $Q_4$ and $Q_5$, hereinbefore more completely identified as to what information they convey, are in FIG. 2 magnified versions of a portion of the FIG. 1 illustration of the same traces; i.e., between the 43rd and 44th time intervals the aforementioned traces $Q_3$, $Q_4$ and $Q_5$ pass through zero amplitude or magnitude on the axis of ordinates and, as is shown, the scaling is in equal fractional parts of one integer of magnitude or amplitude. The COMPOSITE TRACE $Q_6$, $Q_7$ is so called because equation 6 is used where the value of the exponent E in the ideal trace $Q_3$, equation 3, is 1, 2, 3 or 4 and where equation 7 is used where the value of the exponent E in the ideal trace $Q_3$, equation 3, is 5.

FIG. 3 is an illustration, mostly in block diagram form, of one way of implementing the methodology of the invention.

DESCRIPTION OF THE PREFERRED EMBODIMENT(S)

In FIG. 1 there is shown, among other things, the trace or curve labeled as:

$$Q_3 = \pm A 10^{-E} \quad \text{(equation 3)}$$

At the outset it is to be understood that equation 3, hereinbefore set forth, is not the equation of the trace, or curve, of $Q_3$ as a function of t as can be seen from the fact that equation 3 does not contain t. Equation 3 is a mathematical expression defining only, and without reference to time t, the absolute magnitude of the amplitude Q, or $Q_3$, in terms of a mantissa (sometimes called argument) A, a base, or radix, G which happens to be 10 (decimal number system 10) in the instant case and an exponent E. The trace $Q_3$ shown in FIG. 1 represents a small portion of an otherwise conventional amplitude-versus-time characteristic curve of an ideal analog signal that might be generated by a geophone. If the trace $Q_3$ was shown in its entirety it would cover a dynamic range of amplitudes of the order of $10^6$; i.e., the ratio of the highest amplitudes to the lowest amplitudes. Hence, only a small portion of trace $Q_3$ is shown in FIG. 1. Otherwise, FIG. 1 would be an enormous size. The trace $Q_3$ represents a portion of an output analog signal from a geophone, and its purpose in the present discussion is solely to supply analog data which are assumed herein to have been converted, as by a Floating Point Amplifier, to a set of digital data, which digital data in turn are the input data for the apparatus and method of the present invention. Table I hereinafter appearing illustrates this more specifically. There it will be seen that the analog values of $Q_3$ have been read out as a function of the time t and recorded in columns 1 and 2. It is further assumed that these data were fed into a Floating Point Amplifier, which in turn has recorded the same data in floating point digital form, as shown in columns 3 and 4. Thus, for example, the analog value of $Q_3$ at t=27 is 9.5. This is recorded in columns 3 and 4 as A=950 and E=2, since $9.5 = 950 \times 10^{-2}$. Here it is to be understood that for convenience of illustration the base 10 is used, although in actual systems another base such as 8 or 2 may be found more convenient for real equipment. An actual Floating Point Amplifier working on actual seismic analog signal would generally measure $Q_3$ with substantially greater accuracy, showing more significant digits, than is represented in Table I. It must be kept in mind that the data of Table I are not the result of actual use of the Floating Point Amplifier but are merely for illustration of the disclosed apparatus and method. Also it must be kept in mind that $Q_3$ in FIG. 1 and the data derived from it as shown in Table I are fictitious, but representative, data whose purpose is to supply the A and E data in columns 3 and 4, upon which the present invention is illustrated as operating with the results shown in columns 5, 6 and 7 of Table I.

Since the trace $Q_3$ is herein assumed to represent the perfect analog signal delivered by a geophone the main objective of the present invention is to synthesize from the digital A and E data, as in columns 3 and 4 of Table I an acceptable form of $Q_3$ with substantially reduced dynamic range. An acceptable synthesized form of trace $Q_3$ would be one without serious distortion. Distortion, however, has to be introduced because the dynamic range of amplitudes of the trace $Q_3$ has to be compressed or attenuated for the reasons hereinbefore set forth.

In Table I, hereinafter set forth, there is tabulated in columns 1 and 2 (reading from left to right) the magnitude or value of t, the instant of time, and $Q_3$ the corresponding absolute magnitude of the signal of the trace $Q_3$ of FIG. 1. In columns 3 and 4 corresponding values of A, the mantissa, and E, the exponent, are tabulated. The mantissa A and exponent E have been computed by using equation 3 wherein the radix, or base, is the decimal number 10. The reason for determining A and E will appear more fully hereinafter.

The trace $Q_4$, shown in FIG. 1, represents a first attempt, according to the methodology of the present invention, to synthesize and oscillogram, or wiggle trace, which although distorted might be an acceptable facsimile of the form of the ideal trace $Q_3$. It will be noted that it is the *form* of the ideal trace not the actual values of it that is desired to synthesize. Equation 4, which has the algebraic form hereinbefore set forth, is proposed as a first substitute relationship for the relationship defined by equation 3. Again it is to be remembered that equations 3 and 4 are not the equations of traces $Q_3$ and $Q_4$ in the FIGS. 1 and 2 because there is no explicit time term t contained therein. Equations 3 and 4 are expressions of the absolute magnitudes of $Q_3$ and $Q_4$ in terms of a mantissa A and an exponent E. In equation 3 the radix is the decimal number 10. In equation 4 the radix employed is the decimal number 2.

In column 5 in Table I there is tabulated the magnitudes, or values, of $Q_4$ which have been computed from equation 4 which equation employs the mantissa A of column 3, the exponent E of column 4 and the radix 2 instead of the radix 10 as was the case with equation 3, that is we are compressing dynamic range by lowering the radix. $Q_4$, A and E are corrolated with the corresponding instant of time t in column 1.

In FIG. 1 the magnitudes of $Q_4$ as set forth in column 5, Table I, are plotted against instants of time t (column 1). This plot is identified as the trace $Q_4$. It is to be observed that in FIG. 1 the ordinate values of $Q_4$ are to be multiplied, or scaled, by a factor of 10.

An observation of the trace $Q_4$ in FIG. 1 shows the nature and extent of the distortion which has been introduced. Note, for example, the "jumps" which the trace $Q_4$ takes at the time instants 14–15, 26–27, 37–38, 41–42, 44–45, and 50–51. These "jumps" as will be appreciated by reference to Table I are caused by the changes in the exponent E. Hereinafter the "jumps" or distortions are referred to as "exponent jumps". See especially column 1 and column 4, Table I, whereat it clearly appears that: between the intervals of time 14 and 15 exponent E changes from zero to 1; between the intervals of time 26 and 27 exponent E changes from 1 to 2; between the intervals of time 37 and 38 exponent E changes from 2 to 3; between the intervals of time 41 and 42 exponent E changes from 3 to 4; between the intervals of time 44 and 45 exponent E changes from 4 to 3; and between the intervals of time 50 and 51 exponent E changes from 3 to 2.

Exponent jump distortion is largely overcome in a second attempt to synthesize an acceptable form of the ideal trace $Q_3$ by substituting the trace $Q_5$ shown in FIG. 1. Equation 5 which has the algebraic form $$Q_5 = \pm(1+A)2^{-E} \quad \text{(equation 5)}$$

is proposed as another substitute relationship for the relationship of equation 3 and trace $Q_3$ of FIG. 1. Again it is to be remembered that equation 5 is not an equation of the trace $Q_5$ because there is not explicit time term t contained therein. Equation 5 is an expression of the absolute magnitude $Q_5$ in terms of a modified mantissa $(1+A)$ and a modified radix 2, and an exponent E. In equation 3 the radix employed is the decimal number 10 whereas in equation 5 the radix employed is the decimal number 2, which means we have used a radix compression factor of 5 (10 divided by 5 gives 2).

In column 6 of Table I there is tabulated the magnitude of the modified mantissas $(1+A)$, as corrolated with the instants of time t of column 1. In column 7 there is tabulated the magnitudes, or values, of $Q_5$ which have been computed from equation 5 which, in turn, employs the mantissa A of column 3, the modified mantissas of column 6, the exponent E of column 4 and the radix 2 instead of the radix 10 as in equation 3.

As shown in column 6 of Table I the mantissa is modified by adding a 1 to the normalized value of the mantissa A (column 3). By normalized value of the mantissa A, it is meant that the largest value A can possibly have is the decimal number 1.000. In FIG. 1 the magnitudes of $Q_5$ from column 7, Table I, are plotted against instants of time t from column 1. The plot is identified as the trace $Q_5$ in FIG. 1. It is to be remembered that the ordinate values of $Q_5$ are to be divided, or scaled, by a factor of 100 in FIG. 1.

Equation 5 can be expressed in a generalized form:

$$Q_{5a} = \pm(F+A)\left(\frac{G}{B}\right)^{-E} \quad \text{(equation 5a)}$$

wherein the symbols Q, A, G and E are hereinbefore defined and wherein F represents a translation factor and B represents a compression factor. F can be any number including zero.

When the floating point amplifier system switches exponents; e.g., when E changes to E+1 and A/G changes to A, correspondingly then $$\left(F+\frac{A}{G}\right)\left(\frac{G}{B}\right)^{-E} = (F+A)\left(\frac{G}{B}\right)^{-(E+1)}$$

-continued $$F + \frac{A}{G} = (F+A)\left(\frac{G}{B}\right)^{-1}$$

at the instant of change of E to E+1, A changes to its maximum value of 1 and A/G changes to 1/G. Therefore $$F + \frac{1}{G} = (F+1)\frac{B}{G}$$

$$F = \frac{B-1}{G-B} \quad \text{(Equation 5b)}$$

An observation of the trace $Q_5$ in FIG. 1 and of columns 1 and 7 in Table I indicate that the exponent jumps which occurred with the trace $Q_4$ (equation 4) have for the most part been eliminated or at least such jumps introduce but minimal distortions. While equation 5 and trace $Q_5$ largely eliminate exponent jumps, some distortion is, however, introduced where the trace $Q_5$ approaches and crosses zero on the ordinate scale between the time intervals 43 and 44. There are some discrepancies among the values of $Q_3$, column 2, $Q_4$, column 5, and $Q_5$, column 7. In FIG. 2 there is illustrated magnified graphs of a portion of, among others, the traces $Q_3$, $Q_4$ and $Q_5$. The aforementioned traces $Q_3$, $Q_4$ and $Q_5$ are illustrated as they approach Zzero magnitude between the 43rd and 44th intervals of time. An inspection of FIG. 2, Table I and Table II, hereinafter appearing, will reveal the nature and extent of the discrepancies.

The aforementioned discrepancies which occur near zero magnitude, or amplitude, are caused by the addition of 1 to the mantissa A. In FIG. 2 there is clearly illustrated the differences, on the scale of ordinates, between the magnitudes of $Q_3$ and $Q_5$ at a given instant of time t. Compare also the values of $Q_3$ in column 2, Table II with the corresponding values of $Q_5$ in column 7, Table II. Even though there are the discrepances, or distortions, hereinbefore set forth the trace $Q_5$ is nevertheless an acceptable synthesis of the form of the ideal trace $Q_3$.

The aforementioned distortions which occur by adding 1 to the mantissa A and which are due to exponent jumps are largely eliminated or at least, very much diminished by still another attempt to synthesize an acceptable form of the trace $Q_3$. It has been found that a smoother curve (i.e. a more acceptable facsimile of the ideal trace $Q_3$) results when the following equations are employed:

$$Q_6 = \pm(1+A)2^{-E4} \quad \text{(equation 6)}$$

$$Q_7 = \pm A2^{-E5} \quad \text{(equation 7)}$$

Equation 6 is employed where the exponent E for the input signal to the apparatus of this invention column 4, Tables I and II, is 1, 2, 3, or 4. Equation 7 is employed where the exponent for said input signal, column 4, Tables I and II, is 5. Note that the exponent in equation 7 is intentionally made 4 for the output signal of the apparatus of the present invention, even though the exponent for the input signal thereto is 5. This change to the unexpected value 4 from the expected value 5 is made for the reason that it causes a better matching up and continuity between the curves of equations 6 and 7. In FIG. 2, equations 6 and 7, employed in the manner hereinbefore set forth, are shown graphically and identified as the COMPOSITE TRACE. In Table II hereinafter appearing, at column 8, there is tabulated the values of $Q_7$, where from column 4 in the same table the exponent E equals 5. As is illustrated in FIG. 2 the COMPOSITE TRACE ($Q_6$, $Q_7$) closely approximates in form the trace $Q_3$.

In FIG. 3 there is illustrated one way of implementing the methodology, hereinbefore set forth, of the invention. As stated before and as set forth in specific detail with respect to the equations and traces identified as $Q_4$, $Q_5$, $Q_6$ and $Q_7$, the general methodology of the invention is, with respect to equation 2, to change one or more of the mantissa, the radix, and the exponent, in such a way that dynamic range is compressed, and yet any distortion thereby introduced is minimal.

As shown in FIG. 3 the reference number 10 identifies an amplifier system. As is indicated, output signals from the floating point amplifier system 10 are delivered to an analog-to-digital converter 12 and to a gain exponent register 14. The analog-to-digital converter 12 digitizes selected signals received from the floating point amplifier system 10. Also, the gain exponent register 14 temporarily stores signals received from the floating point amplifier system 10.

From the analog-to-digital converter 12 and from the gain exponent register 14 signals representing binary bits "1" or "0" are delivered to a transfer register 16 for temporary storage therein. The transfer register 16, as illustrated in FIG. 3, is capable of storing eighteen binary bits. One bit position is used to represent the sign or polarity of the analog signal. Fourteen bit positions are used to represent the mantissa of the floating point word and three bit positions are used to represent the exponent thereof. As stated hereinbefore with reference to the discussion of equation 2 since the gain of each stage in the floating point amplifier system 10 is eight the only binary bits that need to be processed and recorded are those representing the mantissa A and the exponent E. In the system disclosed in the Vanderford patent application hereinbefore identified it is contemplated that the binary bits stored in the transfer register 16 will ultimately be more permanently stored in storage apparatus 18 such as, for example, on magnetic tape. As is indicated in FIG. 3 by the opposing arrowheads on the line connecting transfer register 16 and storage apparatus 18, storage apparatus 18 can redeliver its stored binary bits back to the transfer register 16 for temporary storage for ultimate processing in the manner hereinafter described.

The elements 10, 12, 14, 16 and 18 contained within the dotted line box comprise the so-called floating point amplifier system disclosed in the Vanderford patent application hereinbefore identified.

Also provided is an additional register 20 for, among other things, temporary storage of the binary bits which are received from transfer register 16. The additional register 20 is labeled in FIG. 3 as "Eighteen binary bit position register". As is indicated in FIG. 3 the register 20 has eighteen positions or storage locations. One of these positions houses the sign or polarity bit. Fourteen of the positions are for storing the bit representative of the mantissa (equation 2). Three of these positions are for storing the bits representing the exponent (equation 2). In register 20 the position for storing the sign bit is labeled SIGN. The positions for storing the bits representing the mantissa are identified as $a_1, a_2 \ldots a_{14}$. The positions for storing the bits representing the exponent are identified as $e_1$, $e_2$ and $e_3$.

As is indicated in FIG. 3 signals in the form of binary bits from the positions $e_1$, $e_2$ and $e_3$ in register 20 are delivered to an exponent decode matrix 22 which is a binary-decimal decoder. Also, signals in the form of binary bits from the SIGN bit position and from the mantissa bit positions $a_1$ through $a_{14}$ in the register 20 are delivered to switch drivers SD±, $SD_1$, $SD_2 \ldots SD_{14}$.

The exponent decode matrix 22 functions to convert the binary form signals, or bits, received from the bit positions $e_1$, $e_2$ and $e_3$ of register 20 to a particular voltage level. The particular voltage level signals are indicated at the output of the exponent decode matrix 22 as $V_1$, $V_2$, $V_3$, $V_4$, and $V_5$. For example, if the positions $e_1$, $e_2$ and $e_3$ in register 20 contained storage signals representing the binary bits 1, 0 and 1, respectively, which is the binary equivalent of the decimal number 5 then only the voltage signal $V_5$ would appear at the output of the exponent decode matrix 22. The significance of the decimal number 5, its binary equivalent and finally the voltage $V_5$ is that initially when the analog signal was being processed through the floating point amplifier system 10 the fifth amplifier path in that system was activated to amplify the signal. The exponent decode matrix 22 may, for example, be a digital-to-analog converter. Also, the exponent decode matrix 22 can, if desired, represent more than five amplifier stages; e.g., eight.

The switch driver SD±, $SD_1$, $SD_2 \ldots SD_{14}$ in response to their respective input signals delivered by the stored signals or bits in the various positions in the register 20 deliver the output signal voltages VS±, $VS_1$, $VS_2 \ldots VS_{14}$. As will be more fully appreciated from the discussion hereinafter appearing the aforementioned output voltages from the exponent decode matrix 22 and from the switch drivers are ultimately used to operate switching devices in a function generator 24 shown within the dotted lines at the bottom of FIG. 3.

The function generator 24 includes a positive reference voltage source 26 and a negative voltage source 28. As shown the output of voltage sources 26 and 28 are coupled to terminals S+ and S−, respectively, of a switch S±. Connected to the switch S± is a first network including the resistors $R_1$, $R_2$, $R_3$ and $R_4$ and the switches $SV_1$, $SV_2$, $SV_3$, $SV_4$, and $SV_5$. As shown in FIG. 3 the aforementioned resistors are serially connected between the switch S± and ground. The switches $SV_1$, $SV_2$, $SV_3$, $SV_4$, and $SV_5$ are, as shown, connected to the various resistors $R_1$, $R_2$, $R_3$, and $R_4$ and to the input of an operational amplifier 30. Operational amplifier 30 has a gain of 1 and serves as an impedance matching device in the function generator 24.

Coupled to the output of operation amplifier 30 is a second network which includes the switches $S_0$, $S_1$, $S_2 \ldots S_{14}$ and the resistors $R_5$, $R_6$, $R_7$, $R_8$, $R_9$, $R_{10} \ldots R_n$ and $R_{n+1}$. As indicated, each of the switches $S_0$ through $S_{14}$ can be connected either to the output of the operational amplifier 30 or to ground. The resistors $R_5$ through $R_{n+1}$ are interconnected in the manner shown in FIG. 3 and the output signal which appears at the junction, or summing point, of resistors $R_5$ and $R_6$ is delivered to a demultiplexer 31 and then to oscillograph 32. The analog nature of the output signal delivered to the oscillograph 32 is set forth in greater detail hereinafter. The oscillograph 32 includes a smoothing network to remove switching transients; said network being called a hold filter.

In the function generator 24 all of the switches S±, SV$_1$, SV$_2$, SV$_3$, SV$_4$, SV$_5$, S$_0$, S$_1$, S$_2$ . . . and S$_{14}$ and illustrated with a conventional symbol for a switch. However, in practice semiconductor switching devices are used and the semiconductor devices are controlled by electrical signals in the manner hereinafter described.

The output signals V$_1$, V$_2$, V$_3$, V$_4$ and V$_5$ from the exponent decode matrix 22 are used to drive the switches SV$_1$, SV$_2$, SV$_3$, SV$_4$, and SV$_5$, respectively. For example, the signal V$_1$ operates switch SV$_1$ such that switch SV$_1$ is closed whenever the exponent E in equations 6 or 7 equals 1. The signal V$_2$ operates switch SV$_2$ such as switch SV$_2$ is closed whenever the exponent E of equations 6 or 7 equal 2. The signal V$_3$ operates switch SV$_3$ such that switch SV$_3$ is closed whenever the exponent E of equations 6 or 7 equals 3. The signal V$_4$ operates switch SV$_4$ such that switch SV$_4$ is closed whenever the exponent E in equations 6 or 7 equals 4. Likewise, the signal V$_5$ operates switch SV$_5$ such that switch SV$_5$ is closed whenever the exponent E in equations 6 or 7 equals 5. Only one of the switches SV$_1$ through SV$_5$ will be closed during a particular time period because only one exponent E is associated with a particular mantissa being processed through the function generator 24. In addition the output signal V$_5$ from the exponent decode matrix 22 is used to control the switch S$_0$. The purpose for signal V$_5$ controlling switch S$_0$ will appear in the discussion hereinafter appearing.

The output signal VS± which is developed by the switch driver SD± is used to operate the switch S± in the function generator 24. Similarly, the output signals VS$_1$, VS$_2$ . . . VS$_{14}$ which are developed by the switch drivers SD$_1$, SD$_2$ . . . and SD$_{14}$, respectively, are employed to operate the switches S$_1$, S$_2$ . . . and S$_{14}$, respectively. The switches S$_1$ through S$_{14}$ are connected either to the output of operational amplifier 30 or to ground depending on the control action of the respective switch drivers SD$_1$ through SD$_{14}$, which control the individual switches S$_1$ through S$_{14}$. With respect to the switch S$_0$ this switch is connected to the output of the operational amplifier 30 whenever the exponent E of the particular equation being used, i.e, equation 6 or 7, is not 5. On the other hand, whenever the exponent E equals 5 the switch S$_0$ is connected to ground. Furthermore, the switch driver SD± in response to the sign digits stored in the register 20 delivers the output signal VS± to control the switch S± in the function generator 24. This switch S± will be in contact with either the positive reference voltage source 26 or the negative source 28.

The analog output voltage delivered to the demultiplexer 31 and the oscillograph 32 which output appears at the junction of resistors R$_5$ and R$_6$, is representative of the equations 6 and 7.

TABLE I

| Col. 1 | Col. 2 | Col. 3 | Col. 4 | Col. 5 | Col. 6 | Col. 7 |
|---|---|---|---|---|---|---|
| t | Q$_3$ | A | E | Q$_4 = \pm A2^{-E}$ | $\pm(1 + A)$ | Q$_5 = \pm(1 + A)2^{-E}$ |
| 13 | 104 | 104 | 0 | 104 | 1.104 | 1.104 |
| 14 | 101 | 101 | 0 | 101 | 1.101 | 1.101 |
| 15 | 97 | 970 | 1 | 485 | 1.970 | 0.985 |
| 16 | 92 | 920 | 1 | 460 | 1.920 | 0.960 |
| 17 | 87 | 879 | 1 | 435 | 1.870 | 0.935 |
| 18 | 81 | 810 | 1 | 405 | 1.810 | 0.905 |
| 19 | 71 | 710 | 1 | 355 | 1.710 | 0.855 |
| 20 | 59 | 590 | 1 | 295 | 1.590 | 0.795 |
| 21 | 44 | 440 | 1 | 220 | 1.440 | 0.720 |
| 22 | 35 | 350 | 1 | 175 | 1.350 | 0.675 |
| 23 | 26 | 260 | 1 | 130 | 1.260 | 0.630 |
| 24 | 21 | 210 | 1 | 105 | 1.210 | 0.605 |
| 25 | 16 | 160 | 1 | 80 | 1.160 | 0.580 |
| 26 | 12 | 120 | 1 | 60 | 1.120 | 0.560 |
| 27 | 9.5 | 950 | 2 | 238 | 1.950 | 0.488 |
| 28 | 7.0 | 700 | 2 | 175 | 1.700 | 0.425 |
| 29 | 5.4 | 540 | 2 | 135 | 1.540 | 0.385 |
| 30 | 4.1 | 410 | 2 | 102 | 1.410 | 0.352 |
| 31 | 3.2 | 320 | 2 | 80 | 1.320 | 0.330 |
| 32 | 2.7 | 270 | 2 | 68 | 1.270 | 0.318 |
| 33 | 2.1 | 210 | 2 | 52 | 1.210 | 0.302 |
| 34 | 1.8 | 180 | 2 | 45 | 1.180 | 0.295 |
| 35 | 1.3 | 130 | 2 | 32 | 1.130 | 0.282 |
| 36 | 1.2 | 120 | 2 | 30 | 1.120 | 0.280 |
| 37 | 1.0 | 100 | 2 | 25 | 1.100 | 0.275 |
| 38 | .80 | 800 | 3 | 100 | 1.800 | 0.225 |
| 39 | .60 | 600 | 3 | 75 | 1.600 | 0.200 |
| 40 | .35 | 350 | 3 | 44 | 1.350 | 0.169 |
| 41 | .20 | 200 | 3 | 25 | 1.200 | 0.150 |
| 42 | .08 | 800 | 4 | 50 | 1.800 | 0.112 |
| 43 | .070 | 700 | 4 | 44 | 1.700 | 0.106 |
| 44 | −.070 | −700 | 4 | −44 | −1.700 | −0.106 |
| 45 | −.15 | −150 | 3 | −19 | −1.150 | −0.144 |
| 46 | −.25 | −250 | 3 | −31 | −1.250 | −0.156 |
| 47 | −.30 | −300 | 3 | −38 | −1.300 | −0.162 |
| 48 | −.55 | −550 | 3 | −69 | −1.550 | −0.194 |
| 49 | −.80 | −800 | 3 | −100 | −1.800 | −0.225 |
| 50 | −.96 | −960 | 3 | −120 | −1.960 | −0.245 |
| 51 | −1.1 | −110 | 2 | −28 | −1.110 | −0.278 |
| 52 | −1.4 | −140 | 2 | −35 | −1.140 | −0.285 |

TABLE II

| Col. 1 t | Col. 2 $Q_3$ | Col. 3 A | Col. 4 E | Col. 5 $Q_4 = \pm A2^{-E}$ | Col. 6 $(1 + A)$ | Col. 7 $Q_5 = \pm(1 + A)2^{-E}$ | Col. 8 $Q_7 = \pm A2^{-E}$ |
|---|---|---|---|---|---|---|---|
| 43.0 | .070 | 700 | 4 | 44 | 1.700 | 0.106 | |
| 43.1 | .040 | 400 | 4 | 25 | 1.400 | 0.088 | |
| 43.2 | .009 | 900 | 5 | 28 | 1.900 | 0.060 | .056 |
| 43.3 | .003 | 300 | 5 | 9.4 | 1.300 | 0.041 | .019 |
| 43.4 | .001 | 100 | 5 | 3.1 | 1.100 | 0.034 | .0063 |
| 43.5 | .000 | 000 | 5 | 0 | 1.000 | 0.031 | 0 |
| 43.6 | −.001 | −100 | 5 | −3.1 | −1.100 | −0.034 | −.0063 |
| 43.7 | −.003 | −300 | 5 | −9.4 | −1.300 | −0.041 | −.019 |
| 43.8 | −.009 | −900 | 5 | −28 | −1.900 | −0.060 | −.056 |
| 43.9 | −.040 | −400 | 4 | −25 | −1.400 | −0.088 | |

Although specific ways and means of practicing the invention have been described hereinbefore and illustrated in the accompanying drawings, it is nevertheless to be understood that this has been done for purposes of illustration only and that the scope of the invention is not to be limited thereby but is to be determined from the appended claims.

What is claimed is:

1. A system for providing an analog output signal representative of an input signal, where said input signal is represented in digital word form, said word being represented in digital signal form by the general algebraic form $Q_1 = \pm AG^{-E}$ wherein $Q_1$ corresponds to the amplitude of the analog output signal, A corresponds to the mantissa, G represents the exponent, and wherein said word is represented by at least one digit representing A, comprising means for providing a signal corresponding to at least one digit representing A, means connected to the A signal means for providing said output signal, and means connected to the A signal means and to the output signal means and receiving the digital signals corresponding to E for affecting the output signal when E changes value so as to minimize distortion in the output signal resulting from a change in the input signal, said distortion minimizing means controls the output signal means to provide the analog output signal in accordance with the following equations:

$$Q_6 = \pm(1+A)2^{-E4}$$

when the exponent E has a value of 4 or less, where $Q_6$ corresponds to the amplitude of the analog output signal and $E_4$ corresponds to the Exponent E, and $$Q_7 = \pm A2^{-E5}$$

when the exponent E has a value of 5, where $Q_7$ corresponds to the amplitude of the analog output signal and $E_5$ corresponds to the exponent E.

2. A system for providing an analog output signal representative of an input signal, where said input signal is represented in digital word form, said word being represented in digital signal form by the general algebraic form $Q_1 = \pm AG^{-E}$ wherein $Q_1$ corresponds to the amplitude of the analog output signal, A corresponds to the mantissa, G represents the radix of the number system and E represents the exponent, and wherein said word is represented by at least one digit representing A, comprising means for providing a signal corresponding to at least one digit representing A, means connected to the A signal means for providing said output signal, and means connected to the A signal means and to the output signal means and receiving the digital signals corresponding to E for affecting the output signal when E changes value so as to minimize distortion in the output signal resulting from a change in the input signal, said distortion minimizing means includes means receiving digital signals corresponding to exponent E for providing control signals in accordance with exponent E signals and the output signal means include means connected to the control signal means for providing an analog signal corresponding to $\pm 2^{-E}$ in accordance with the control signals, and means connected to the analog signal means and to the control signal means for providing the analog output signal as a function of $$Q_6 = \pm(1+A)2^{-E4}$$

when the exponent E has a value of 4 or less, where $Q_6$ is the amplitude of the analog output signal, and $E_4$ represents the exponent E and as a function of $$Q_7 = \pm A2^{-E5}$$

when the exponent E has a value of 5, where $Q_7$ is the amplitude of the analog ouput signal and $E_5$ represents the exponent E.

3. In a system wherein wide dynamic amplitude range analog signals are represented in digital word form, said word being represented in digital signal form by the general algebraic form $Q_1 = \pm AG^{-E}$ wherein $Q_1$ represents the amplitude of the analog signal, A represents the mantissa, G represents the radix of the number system used and E represents the exponent, and wherein said word is represented by at least one digit representing E, the method of making compressed dynamic amplitude analog signals from the digital floating point words comprising: (a) generating a driving signal corresponding to at least one digit representing E; and (b) generating a minimally distorted compressed dynamic amplitude analog signal in response to the driving signal corresponding to said at least one digit representing E, said compressed dynamic amplitude range analog signal being defined by the equation $$Q_{5a} = \pm(F + A)\left(\frac{G}{B}\right)^{-E}$$

wherein $Q_{5a}$ represents the amplitude of the compressed analog signal, F represents a translation factor, B represents a compression factor, and wherein $$F = \left(\frac{B-1}{G-B}\right).$$

4. A method as described in claim 3 wherein G has a value of 8.

* * * * *